United States Patent [19]

Kundinger et al.

[11] Patent Number: 4,746,561
[45] Date of Patent: May 24, 1988

[54] POLYIMIDE-CONTAINING COVER LAYER FOR A PRINTED CIRCUIT ELEMENT

[75] Inventors: Ernst F. Kundinger, Breuberg/Neustadt; Erich Klimesch, Erlenbach; Hans-Georg Zengel, Kleinwallstadt, all of Fed. Rep. of Germany; Jeffery D. Lasher, Tolland, Conn.

[73] Assignee: Akzo N.V., Netherlands

[21] Appl. No.: 832,229

[22] Filed: Feb. 24, 1986

[30] Foreign Application Priority Data

Feb. 25, 1985 [DE] Fed. Rep. of Germany ....... 3506526

[51] Int. Cl.$^4$ .................... B32B 3/00; B32B 27/08
[52] U.S. Cl. ..................... 428/209; 428/200; 428/520; 428/901; 427/388.1; 427/93
[58] Field of Search ............. 428/901, 200, 209, 520; 427/93, 388.1; 524/99; 526/262

[56] References Cited

U.S. PATENT DOCUMENTS

| | | |
|---|---|---|
| 3,179,614 | 4/1965 | Edwards . |
| 3,179,634 | 4/1965 | Edwards . |
| 3,264,250 | 8/1966 | Gall . |
| 3,770,573 | 11/1973 | Dunphy et al. ............ 161/227 |
| 3,822,175 | 7/1974 | Yuan . |
| 3,847,870 | 11/1974 | Takekoshi ............ 260/47 CP |
| 3,900,662 | 8/1975 | Yuan . |
| 3,929,713 | 12/1975 | D'Alelio ............ 260/32.6 |
| 3,981,847 | 9/1976 | Meyer et al. . |
| 3,995,293 | 11/1976 | Numata et al. ............ 359/202 |
| 4,075,420 | 2/1978 | Walton . |
| 4,118,377 | 10/1978 | D'Alelio ............ 526/236 |
| 4,238,538 | 12/1980 | Manwiller . |
| 4,395,527 | 7/1983 | Berger ............ 528/26 |
| 4,480,009 | 10/1984 | Berger ............ 428/447 |
| 4,499,149 | 2/1985 | Berger ............ 428/447 |
| 4,508,766 | 4/1985 | Inaike et al. . |
| 4,522,880 | 6/1985 | Klostermeier et al. . |
| 4,543,295 | 9/1985 | St. Claire et al. . |
| 4,562,119 | 12/1985 | Darms et al. ............ 421/458 |
| 4,576,857 | 3/1986 | Gannett et al. ............ 428/260 |
| 4,590,258 | 5/1986 | Linde et al. . |
| 4,609,569 | 9/1986 | Edelman et al. ............ 427/93 |
| 4,647,508 | 3/1987 | Gazit et al. ............ 428/421 |

FOREIGN PATENT DOCUMENTS

| | | |
|---|---|---|
| 0048315 | 5/1981 | European Pat. Off. . |
| 0116297 | 8/1984 | European Pat. Off. . |
| 2006134 | 9/1970 | Fed. Rep. of Germany . |
| 3000860 | 7/1972 | Fed. Rep. of Germany . |
| 3215944 | 2/1982 | Fed. Rep. of Germany . |
| 3301197 | 7/1984 | Fed. Rep. of Germany . |
| 0004374 | 1/1979 | Japan . |
| 0067539 | 4/1985 | Japan . |
| 1317321 | 4/1970 | United Kingdom . |
| 1464009 | 5/1974 | United Kingdom . |

OTHER PUBLICATIONS

"Perfluoroalkylene-Linked Aromatic Polymers", 12 Jul. 1969, Chemistry and Industry, by J. P. Critchley, V. C. R. McLoughlin, J. Thrower & I. M. White.
"Metallic Glasses", Scientific American, 1980, 242(4), Praveen Chaudhairi, Bill C. Giessen and David Turnbull.
Handbook of Adhesives, 2nd Edition, Irving Skeist, pp. 597–618, Elecktro-Anzeiger 36, Jg. 1983 Nr. 6, pp. 44–46.

Primary Examiner—John E. Kittle
Assistant Examiner—Patrick J. Ryan
Attorney, Agent, or Firm—Parkhurst & Oliff

[57] ABSTRACT

A printed circuit element in which the outer conductor layers of the electrical components arranged on the outer conductor layers are provided with a cover layer. The cover layer includes a heat-sealable high-temperature adhesive joined to a layer of intractable fully aromatic polyimide.

The described circuit elements show very good mechanical, thermal and electrical properties and may be used advantageously inter alia in electronics, radio technology, computer technology, electric motors, aircraft and aerospace and telecommunications.

10 Claims, 1 Drawing Sheet

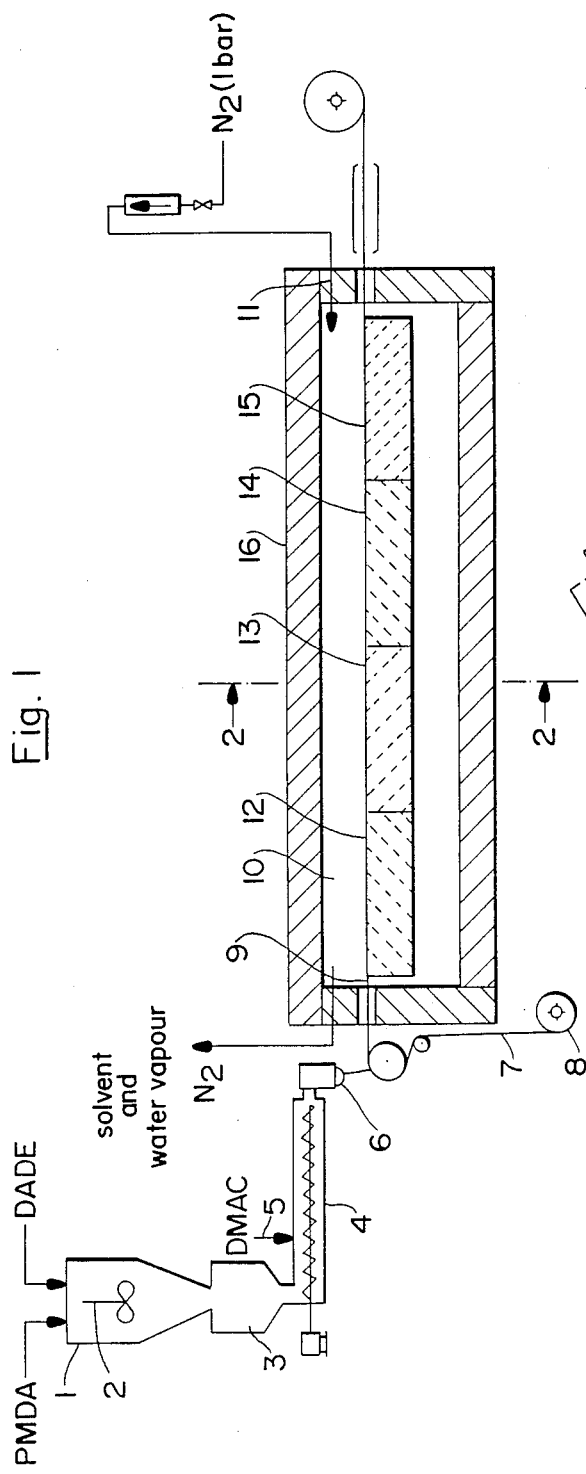

POLYIMIDE-CONTAINING COVER LAYER FOR A PRINTED CIRCUIT ELEMENT

BACKGROUND OF THE INVENTION

This invention relates to a printed circuit element comprising one or more metallic conductor layers and insulating layers fixedly joined to the conductor layers and a cover layer being arranged on the outer conductor layers or on the electrical components arranged thereon. Printed circuit elements are widely used inter alia in electronics, radio technology, computer technology, aircraft and aerospace, telecommunications and in electric motors. For purposes of electrical insulation, the printed electrical circuits are covered at least partially by an insulating cover layer.

The electrically insulating cover layer generally consists of an insulating lacquer applied to the circuit element. However, the insulating lacquers generally used leave the circuit elements to which the lacquers are applied with a number of disadvantages, namely:

(a) The insulating lacquers are not sufficiently heat-stable to withstand the extreme temperatures which can occur in the practical application of the printed circuit elements, without sustaining damage thereto. Thus, detrimental dimensional changes of the insulating properties can occur at high temperatures.

(b) The lacquers are often mechanically unsatisfactory insofar as they are easily scratched and can flake off, again to the detriment of the electrical insulating effect.

(c) The lacquers show unsatisfactory dielectric properties, often having inadequate electrical strength and the frequency behavior of the circuit elements to which the lacquers are applied can be impaired, for example through variations in the dielectric constant.

SUMMARY OF THE INVENTION

Accordingly, the object of the present invention is to provide a printed circuit element of the type described above, provided with a flexible cover layer having high electronic quality and which is stable up to and including extreme thermal and mechanical conditions.

According to the invention, the above object is achieved by a printed circuit element of the type described above wherein the cover layer comprises a laminate of an intractable, fully aromatic polyimide insoluble in phenolic solvents and a heat-sealable high-temperature adhesive joined directly thereto, and wherein the surface of the high-temperature adhesive which is not joined to the fully aromatic polyimide is joined to the outer conductor layer or to the electrical components arranged as the outer conductor layer.

BRIEF DESCRIPTION OF THE DRAWINGS

FIG. 1 is a cross section of a suitable apparatus for carrying out the process steps described herein.

FIG. 2 is a cross section on line 2—2 of FIG. 1, through the condensation or curing furnace.

DETAILED DESCRIPTION OF THE INVENTION

In the context of the invention, a printed circuit element is understood to be a planar circuit on an insulating substrate(s), on which a conductive pattern has been produced by a subtractive or additive process. In the subtractive process, the substrate material (insulating layer) is covered initially on one or both sides by an electrically conductive metal layer. The conductive pattern is applied to the metal layer as a photopolymeric mask covering by printing or by a photocopying process. Thereafter, the unwanted exposed parts of the metal layer are etched away and the photopolymeric mask removed, leaving the conductive pattern, in the form of conductors, behind. In the additive process, the conductive pattern is printed as a catalytic layer onto the insulating substrate, after which a metal layer is deposited onto this catalytic layer. Electrical components are then applied, generally by soldering, to the conductors obtained in the subtractive or additive process.

An electrically insulating cover layer then is applied to the conductors. In addition, an insulating cover layer can also be applied to the component side. This insulating cover layer must adhere firmly to the conductors or to the component side and must afford effective electrical insulation. In addition, the insulating cover layer is required to withstand extreme temperatures.

Fully aromatic, intractable polyimides show excellent properties so far as electrical insulation and thermal stability are concerned. This is apparent, for example, from DE-OS No. 22 27 953. Accordingly, they would be suitable on the basis of those properties as a cover layer for printed circuit elements. However, it has been found that these polyimides cannot be directly joined to the conductors or to the electrical components arranged thereon to form circuit elements in which the adhesion between the cover layer of polyimide and the circuit element is strong enough to withstand severe mechanical stressing. This is attributable to the fact that, after curing, these polyimides, which are obtained from aromatic tetracarboxylic acids or their dianhydrides and aromatic diamines, are neither formable nor soluble in conventional solvents. The adhesion between the polyimide and the conductor can certainly be increased by applying the polyimides or their intermediate stage to the circuit element before curing is completed. However, since volatile constituents, including water, are released during the curing process, the release of these constituents can be impeded by the applied circuit element and bubbles can form in the polyimide layer.

It has now been found that a printed circuit element having a high-quality cover layer can be obtained if the cover layer comprises an intractable fully aromatic polyimide which is insoluble in phenolic solvents and which is joined directly, i.e., without an intermediate layer, to a heat-sealable high-temperature adhesive. The cover layer is joined to the conductors or to the electrical components arranged on the conductors on the heat-sealable high-temperature adhesive side.

In the context of the invention, "fully aromatic, intractable polyimides insoluble in phenolic solvents" are understood to be polyimides which are obtained from aromatic tetracarboxylic acids or their dianhydrides and primary aromatic diamines, the carboxyl groups and the primary amino groups being directly attached to an aromatic ring. In addition, the polyimides of the present invention cannot be melted without decomposition and are insoluble in conventional solvents, including phenolic solvents, such as phenol, cresols and halogenated phenols. Accordingly, these polyimides cannot be formed again by melting or by dissolving.

The intractable polyimides can be obtained by reaction of tetracarboxylic acids or their mono- or dianhydrides with diamines. Examples of suitable dianhydrides are pyromellitic acid dianhydride, 2,3,6,7-naphthalene tetracarboxylic acid dianhydride, 3,4,3',4'-diphenyl sulfone tetracarboxylic acid dianhydride, perylene-3,4,9,10-tetracarboxylic acid dianhydride, 3,4,3',4'-diphenyl ether tetracarboxylic acid dianhydride.

Examples of diamines which may be reacted with the tetracarboxylic acids or their derivatives to give suitable intractable fully aromatic polyimides are 4,4'-diaminodiphenyl ether, 5-amino-2-(p-aminophenyl)-benzothiazole, 4-amino-2-(p-aminophenyl)-benzothiazole, 5-amino-2-(m-aminophenyl)-benzothiazole, 5-amino-2-(p-aminophenyl)-benzoxazole, 4-amino-2-(m-aminophenyl)-benzothiazole, p- and m-phenylene diamine, 4,4'-diamino-diphenyl, bis-(4-aminophenyl)-methane, 4-amino-2-(p-aminophenyl)-benzoxazole, 4-amino-2-(m-aminophenyl)-benzoxazole, 5-amino-2-(m-aminophenyl)-benzoxazole, 2,5-diaminobenzoxazole, 2,5-diaminobenzothiazole.

The polyimide obtainable by reaction of pyromellitic acid dianhydride (PMDA) with 4,4'-diaminodiphenylether (DADE) has proven to be particularly suitable.

Intractable polyimides can be obtained from the above-mentioned compounds via the polyamide acid intermediate stage, for example, wherein a polyimide layer initially is produced on a metal foil, for example, copper. The process is generally as follows.

The polyamide acid is produced by reacting an aromatic tetracarboxylic acid, preferably pyromellitic acid or its dianhydride, pyromellitic acid dianhydride (PMDA), with a primary aromatic diamine, preferably 4,4'-diaminodiphenyl ether (DADE), in a solvent, such as for example dimethyl acetamide (DMAc). The polyimide-coated foil is obtained by applying a film of the polyamide acid solution to a metal foil and curing the film in situ by heat treatment in at least two stages so that a so-called single clad is obtained, wherein the polyimide layer adheres to the foil.

A primary aromatic diamine is reacted, for example in an extruder, with an aromatic tetracarboxylic acid or its dianhydride under conditions which lead to the formation of a solution of polyamide acid in a solvent. A layer of the polyamide acid solution may then be directly extruded onto the foil, after which most of the solvent may be removed in situ from the polyamide acid layer in a first heating zone and the polyamide acid layer subsequently cured in situ by another heat treatment in at least one second heating zone at a higher temperature, leading to almost complete imidization. Instead of applying the polyamide acid solution to the foil by extrusion, it may also be applied by doctoring. A subsequent heat treatment of the applied solution results in removal of the solvent and in formation of the polyimide. For example, a polyimide layer, more than 10 μm thick, which does not have any interruptions or defects caused by bubbles produced by the combination of a skin effect and over-rapid evaporation of the solvent or of the water vapour formed during imidization or curing and which adheres firmly to the substrate may be obtained by a particular sequence of heat treatments.

The polyamide acid precursors used in the process and obtained by the reaction of an aromatic tetracarboxylic acid or its dianhydride with a primary aromatic diamine in a polar organic solvent have the following structural formula:

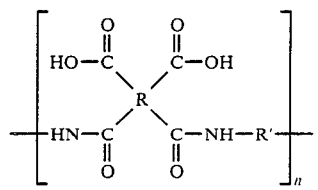

wherein
R is an aromatic tetravalent group,
R' is a divalent aromatic group and
n has a value sufficient for the formation of a polyamide acid having a reduced viscosity of 0.5 or higher, as measured on a 0.5% solution in dimethyl acetamide containing 0.1 mole/liter of lithium bromide. After application to the substrate, the polyamide acid is cured by the described heating process, resulting in the formation of an intractable polyimide insoluble in phenol or phenolic solvents and having the following recurring structure:

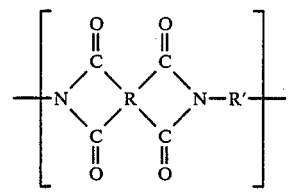

wherein R and R' represent the same groups as previously described.

Pyromellitic acid dianhydride and 4,4'-diaminodiphenyl ether are preferably used as starting materials and dimethyl acetamide as solvent in the production of the polyamide acid.

Other reactants which produce intractable polyimides insoluble in conventional phenolic solvents, for example phenol or substituted phenols (halogenated phenols), may also be extruded by the process for producing the single clads.

Although dimethyl acetamide (DMAc) is preferably used as the solvent, it is also possible to use other polar organic solvents, for example N,N-dimethylmethoxy acetamide, dimethyl formamide (DMF), diethyl formamide, N-methyl-2-pyrrolidone (NMP) and dimethyl sulfoxide (DMSO). Other suitable solvents are, for example, N-methyl caprolactam, dimethyl sulfone, pyridine, hexamethyl phosphoric acid triamide, N-acetyl-2-pyrrolidone, tetramethyl urea and tetramethylene sulfone.

The polyamide acid may be produced by known methods, for example by the methods described in U.S. Pat. Nos. 3,179,614 and 3,179,634.

In the apparatus illustrated in FIG. 1, a dry mixture is prepared for example from the dianhydride (pyromellitic acid dianhydride or PMDA) and the diamine (4,4'-diaminodiphenyl ether or DADE) in a molar ratio of from 0.95:1 to 1.05:1. This mixture is then introduced at an accurately controlled rate into a reaction vessel 4 in the form of an extruder. A polar solvent is added by means of a metering pump 5 to the dry mixture accommodated in the extruder 4. The molecular weight of the polyamide acid is determined by the molar ratio of dianhydride to diamine. The optimal molecular weight range of the polyamide acid is reached at a molar ratio of from 0.98 to 1.02 and is measured as the reduced viscosity ($\eta$ red) of a 0.5% solution in dimethyl acetamide containing 0.1 mole/liter of lithium bromide. The reduced viscosity of the polyamide acid is of the order of 0.5 for molar ratios of PMDA to DADE of 0.95:1 and 1.05:1 and is in the range from about 1.0 to 4.0 at the optimal ratio (PMDA:DADE 0.98:1 to 1.02:1). The average molecular weight of the polyamide acid formed was 32,000 for a molar ratio of 0.95, approximately 200,000 for a molar ratio of 1.0 and approximately 35,000 for a molar ratio of 1.03 (as determined with a FIKA light scattering photometer, model PGD 42,000, at $\lambda = 436$ nm).

The temperature in the extruder 4 should be kept at a level below about 80° C. In practice, however, it may be gradually increased, starting from about 20° C., or raised to at most 80° C. in zones of increasing temperature. The solvent is added in the first zone of the extruder 4. The residence time in the extruder 4 is from 1 to 5 minutes. At the end of this residence time, the reaction by which the polyamide acid is formed is over. The polyamide acid with a reduced viscosity of from 0.5 to 4.0 and preferably of more than 1.0 may be extruded through a flat die 6 onto a foil 7.

The foil coated with the polyamide acid solution then passes through a furnace 10, to which nitrogen is fed by means of a supply pipe 11, for 5 to 20 minutes or longer for the purpose of condensation to the polyimide. The residence time in the furnace depends on the thickness of the film because longer times are required for relatively thick films.

Control of the temperatures in the successive zones of the furnace has proven to be essential. However, if the temperature is controlled within the above-mentioned range, an intractable bubble-free polyimide layer having excellent electrical and mechanical properties is formed on the foil 7 in a very short time. It may be assumed that it is necessary for the solvent to diffuse through the polyamide acid layer and to be released from the exposed layer surface so slowly that it does not form any bubbles which increase in size and remain trapped in the matrix of the polymer layer. Also, a large part of the solvent must be released from the exposed side of the polyamide acid layer before imidization is complete. In addition, from 80 to 90% of the imidization reaction must be completed at temperature below about 180° C., so that the majority of the water formed during the cyclization reaction also diffuses to and is released from the surface of the layer.

To achieve the object stated above, the following heating zones are established in the condensation furnace by means of resistance elements 12, 13, 14 and 15:

In the first zone, the temperature is kept at 100 to 150° C. by an electrical resistance element 12. In the second zone, the temperature is increased to between about 130° C. and about 200° C., but preferably below 180° C. In the third zone, the temperature is increased to between about 200° and 400° C. after virtually all the solvent and also the majority of the water formed during the cyclization reaction have diffused to the surface and been removed. In the fourth zone, the temperature is again increased, preferably to between about 300° and 600° C. These heating zones are approximately equal in length, so that the residence time in the individual zones is also about the same. However, the progress rate and hence the throughput may be increased by extending the first and/or second zone or by preceding the first zone with an additional heating zone kept at a temperature about 50° C., but below the temperature of the first zone. In the cross section of the apparatus shown in FIG. 2, the furance 10 may be provided with a removable cover 16 to provide easy access to the laminated element in the furnace.

A layer of intractable fully aromatic polyimide insoluble in phenolic solvents adhering to a foil is obtained by the described process.

Removal of the metal foil by etching leaves a polyimide layer which is one component of the cover layer of the circuit elements according to the invention.

The second component of this cover layer is a heat-sealable high-temperature adhesive which is directly joined to the polyimide layer.

In the context of the invention, heat-sealable high-temperature adhesives are understood to be products which are formable at a temperature of from 140° and 500° C., optionally under pressure, and at the same time show a bonding effect. They must not melt at temperatures below 200° C. However, the products used as high-temperature adhesives do not necessarily have to show a defined melting point or melting range. It is sufficient if they can be formed without melting at a temperature in the above-mentioned range. As already mentioned, the high-temperature adhesives must have a bonding effect. This means that a laminate of polyimide and adhesive produced as described in the following must have a peel strength, as measured by the method described in IPC TM 650, 2.4.9, of at least 2.0N/cm. The laminate used for this test is produced as follows:

A single clad of metal and polyimide is produced by the process described above. The adhesive to be tested is applied to the polyimide layer in the form of a solution or in the form of a film. When the adhesive is applied as a solution, the solvent is removed by heating. The adhesive is then heat-sealed to the polyimide layer at a temperature of from 140° to 500° C., optionally under pressure. The suitable temperature and pressure conditions depend upon the nature of the adhesive and may be determined by simple tests. After removal of the metal layer, for example by etching, the peel strength may be determined. Products which, applied either from solution or as a film, do not produce a peel strength of at least 2.0N/cm throughout the temperature range mentioned above, even under pressure, are unsuitable as adhesives for the circuit elements according to the invention.

The stipulation that the adhesives must be heat-sealable, i.e., formable, at a temperature of from 140° to 500° C. does not mean that all adhesives which satisfy this requirement are suitable for every application of the circuit elements according to the invention. On the contrary, adhesives which are only formable at 250° C. or higher may have to be used for a specific application.

The laminated element of polyimide andd adhesive in the circuit elements according to the invention advantageously has a peel strength of greater than 4.0N/cm.

In one preferred embodiment of the invention, the heat-sealable high-temperature adhesive is a heat-sealable polyimide. Heat-sealable polyimides show very good electrical and mechanical properties.

Particularly preferred examples of heat-sealable polyimides are polyimides of the type obtained by reaction of benzophenone tetracarboxylic acid dianhydride (BTDA) or a mixture of this dianhydride and pyromellitic acid dianhydride with 4,4'-diaminodiphenyl ether, 3,3'-diaminodiphenylether, 3,3'-diaminodiphenylsulfone, 3,3'-diaminodiphenylmethane, 4,4'-diaminodiphenylsulfone (DDS), benzidine or 4,4'-diaminodiphenyl methane (DDM) or with mixtures of these diamines. In this connection, it is possible to use mixtures containing two or more of the above-mentioned diamines. In this connection benzophenone tetracarboxylic acid dianhydride may be the 2,3,2',3'- or the 3,4,3',4'- or the 2,3,3',4'-isomer or a mixture of these isomers. In addition, good results have been obtained with heat-sealable polyimides wherein the heat-sealable polyimide is the reaction product of a dianhydride with a diamine, wherein the dianhydride is represented by the following formula:

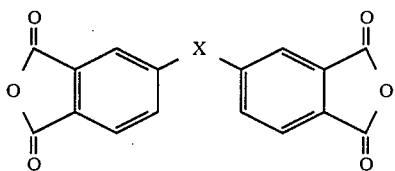

wherein X is an oxygen atom, a $C_nF_{2n}$-group, where $n=1-10$, or the group represented by:

wherein R is a hydrogen atom or a fluorine atom and wherein the $C(CR_3)_2$-group is located in the meta- or para-position relative to the associated oxygen atom, and wherein the diamine is represented by the formula:

or to the formula:

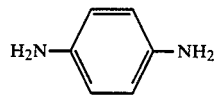

wherein Y is an oxygen atom, a $C_nF_{2n}$-group, where $n=1-10$, or a carbonyl group and is located in the meta- or para-position relative to the associated amino group.

The $C_nF_{2n}$-group may be a linear or branched perfluorinated alkyl group. Other examples of suitable dianhydrides which can be reacted with diamines to yield heat-sealable polyimides are compounds of the following formula:

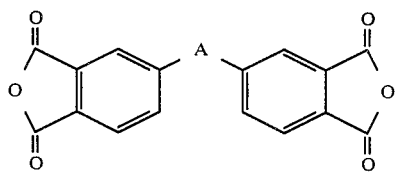

wherein A represents one of the following groups:

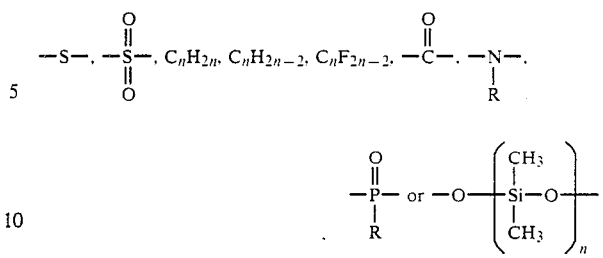

wherein n is a number from 1 to 10 and R is a linear or branched alkyl group, a linear or branched alkyl group partially or completely halogenated, or an aromatic or a heteroaromatic group. Other examples of suitable diamines which can be reacted with dianhydrides to yield heat-sealable polyimides are compounds of the following formula:

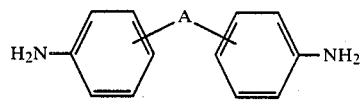

wherein A has the same meaning as above.

In the above-mentioned diamines, one or more other substituents may optionally be present on one or both aromatic rings. The heat-sealable polyimides may of course also be produced from other starting compounds, for example by reaction of the tetracarboxylic acids on which these dianhydrides are based with the above-mentioned diamines.

Several of these known heat-sealable polyimides are mentioned, for example, in DE-PS No. 24 16 595, in DE-PS No. 24 41 101, in U.S. Pat. No. 3,264,250 and in "Chemistry and Industry" 12/7/1969, p. 934.

The heat-sealability or rather formability requirement which the polyimides have to satisfy is not solely a question of the chemical nature of the starting compounds, i.e., the dianhydride and the diamine. On the contrary, the production conditions, such as for example the reaction temperature and the molar ratio of the reactants, are also important factors. In other words, the choice of the production conditions can determine whether either an intractable or a formable and, hence, heat-sealable polyimide is formed from the same starting compounds.

Another embodiment of the circuit elements according to the invention is characterized in that the heat-sealable high-temperature adhesive is a high-temperature adhesive selected from the group consisting of polyacrylates, epoxy resins, fluoropolymer resins, polysulfone resins, silicone resins or butyl rubbers.

The outer conductor layers of the circuit elements according to the invention preferably consist of copper, nickel, aluminium, silver, gold, fine steel or titanium or of an alloy containing one or more of these metals as its principal constituent.

Starting out from the single clads of intractable polyimide and metal foil, of which the production is described in the foregoing, the circuit elements according to the invention may be obtained by the following process:

A layer of heat-sealable high-temperature adhesive is applied either in the form of a solution or in the form of a film to the exposed side of the polyimide layer. The polyimide layer is joined to the layer of adhesive at a temperature at which the adhesive is formable, i.e. sealable, optionally under pressure. In many cases, it is advantageous to apply the adhesive during the actual production of the single clad, i.e. before the intractable polyimide is completely cured, in order to obtain increased adhesion between polyimide and adhesive after curing.

Before the layer of high-temperature adhesive is joined to the conductor layers of the circuit element, the metal foil joined to the intractable polyimide is removed. This may be done, for example, by etching with aqueous peroxodisulfuric acid. Removal of the metal foil by etching may be carried out before or after the intractable polyimide is joined to the adhesive.

The cover layer of polyimide and adhesive is then applied to the outer conductor layers or to the electrical components arranged thereon. This is again done by heat-sealing the adhesive layer with the conductor layers or components at a temperature at which the adhesive is formable, optionally under reduced or excess pressure. The sealing of the adhesive with the layer of intractable polyimide (from which the metal foil has been removed by etching) and with the conductor layers may optionally be carried out in one and the same operation.

The circuit elements according to the invention have the following advantages:

(a) They show high thermal stability and are therefore suitable for circuits which are exposed to extreme temperature conditions, as encountered for example in aircraft and aerospace and telecommunications, in mining, in marine applications, in high-quality electrical motors, in the control of power plants and computer technology. They show low dielectric dissipation factors and, accordingly, may even be used at very high frequencies in the MHZ range and higher.

The circuit elements according to the invention may also contain highly integrated groups of components which are applied to the conductor side directly and without the need for separate housing by means of masks without any need for soldering and sealed to the cover layer. In this way, the high packing density of integrated circuitry and the high packing density of the printed circuits are combined with one another.

We claim:
1. A printed circuit element comprising:
at least one metallic conductor layer, said conductor layer having an outer portion;
at least one insulating layer joined to said metallic conductor layer; and
at least one cover layer joined to at least one said outer portion of said conductor layer or electrical components contained on said outer portion of said conductor layer, said cover layer comprising:
a laminate of an intractable fully aromatic polyimide, said aromatic polyimide being insoluble in phenolic solvents; and
a heat sealable high temperature adhesive arranged between said laminate and at least one of said outer portion of said conductor layer and said electrical components, wherein said aromatic polyimide is obtained by the process comprising the steps of:
reacting an aromatic tetracarboxylic acid or the dianhydride thereof and an aromatic diamine in the molar ratio of said tetracarboxylic acid or dianhydride to said diamine in the range of 0.95 to 1.05 in a polar organic solvent to form a polymeric composition comprising a polymeric acid having the formula:

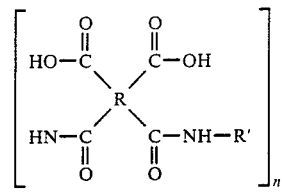

wherein
R is an aromatic tetravalent radical,
R' is a divalent aromatic radical and
n has a value sufficient for the formation of a polyamide acid with a η red of 0.5 or higher;
extruding a film of said polyamide acid onto a metallic foil;
removing the solvent from said film in a first stage, said first stage having a temperature in the range of from 100° to 200° C., whereby substantially all of the solvent is removed and said polyamide acid is partially cured to polyimide;
further curing said partially cured polyamide acid to form an insoluble, intractable polyimide in a second stage, said second stage having a temperature of at least 200° C., whereby at least 95% of said polyamide acid is converted to said polyimide, without the application of a roller on said film to remove the solvent; and
removing the metallic foil by etching.

2. A circuit element according to claim 1, wherein said high-temperature adhesive is a heat-sealable polyimide.

3. A circuit element according to claim 2, wherein the heat-sealable polyimide comprises the reaction product of benzophenone tetracarboxylic acid dianhydride (BTDA) or a mixture of BTDA and pyromellitic acid dianhydride with a member selected from the group consisting of 4,4'-diaminodiphenyl ether, 3,3'-diaminodiphenylether, 3,3'-diaminodiphenylsulfone, 3,3'-diaminodiphenylmethane, 4,4'-diaminodiphenyl sulfone, 4,4'-diaminodiphenyl methane, benzidine and mixtures of these diamines.

4. A circuit element according to claim 2, wherein the heat-sealable polyimide is the reaction product of a dianhydride with a diamine, said dianhydride corresponding to the following formula:

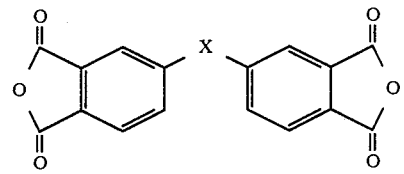

wherein X is an oxygen atom, a $C_nF_{2n}$-group where n = 1-10, or the group

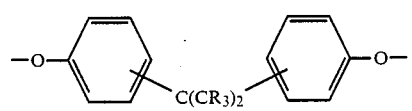

wherein R is a hydrogen atom or a fluorine atom and wherein the C(CR$_3$)$_2$-group is located in the meta- or para-position relative to the associated oxygen atom; and said diamine corresponding to one of the following formulas:

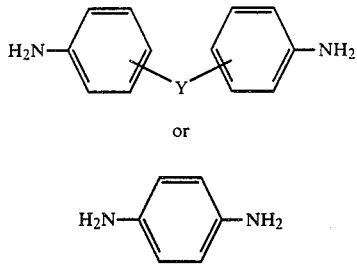

wherein Y is an oxygen atom, a C$_n$F$_{2n}$-group, wherein n=1-10, or a carbonyl group and is located in the meta- or para-position relative to the associated amino group.

5. A circuit element according to claim 1, wherein the heat-sealable high-temperature adhesive is a high-temperature adhesive selected from the group consisting of polyacrylates, epoxy resins, fluoropolymer resins, polysulfone resins, silicone resins and butyl rubbers.

6. A circuit element according to claim 1, wherein said outer portion of said conductor layer is a metal selected from the group consisting of copper, nickel, aluminum, silver, gold, fine steel, titanium and an alloy containing one or more of these metals as its principal constituent.

7. A circuit element according to claim 2, wherein said outer portion of said conductor layer is a metal selected from the group consisting of copper, nickel, aluminum, silver, gold, fine steel, titanium and an alloy containing one or more of these metals as its principal constituent.

8. A circuit element according to claim 3, wherein said outer portion of said conductor layer is a metal selected from the group consisting of copper, nickel, aluminum, silver, gold, fine steel, titanium and an alloy containing one or more of these metals as its principal constituent.

9. A circuit element according to claim 4, wherein said outer portion of said conductor layer is a metal selected from the group consisting of copper, nickel, aluminum, silver, gold, fine steel, titanium and an alloy containing one or more of these metals as its principal constituent.

10. A circuit element according to claim 5, wherein said outer portion of said conductor layer is a metal selected from the group consisting of copper, nickel, aluminum, silver, gold, fine steel, titanium and an alloy containing one or more of these metals as its principal constituent.

* * * * *

UNITED STATES PATENT AND TRADEMARK OFFICE
CERTIFICATE OF CORRECTION

PATENT NO. : 4,746,561

DATED : May 24, 1988

INVENTOR(S) : Ernst F. KUNDINGER et al

It is certified that error appears in the above-identified patent and that said Letters Patent is hereby corrected as shown below:

On the cover page, in Section [57], line 2, change "of" to --or--.

Column 1, line 49, change "polymide" to --polyimide--.

Column 6, line 1, change "about" to --above--;

line 3, change "furance" to --furnace--.

Signed and Sealed this

Fifteenth Day of November, 1988

Attest:

DONALD J. QUIGG

*Attesting Officer*   *Commissioner of Patents and Trademarks*